US012784299B2

(12) United States Patent
Okada et al.

(10) Patent No.: US 12,784,299 B2
(45) Date of Patent: Nov. 3, 2026

(54) REVISION HISTORY REPLAY DEVICE, REVISION HISTORY REPLAY METHOD, AND COMPUTER READABLE MEDIUM

(71) Applicant: Mitsubishi Electric Corporation, Tokyo (JP)

(72) Inventors: Masazumi Okada, Tokyo (JP); Yasuhiro Omori, Tokyo (JP); Masakatsu Toyama, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 225 days.

(21) Appl. No.: 18/882,454

(22) Filed: Sep. 11, 2024

(65) Prior Publication Data

US 2025/0005817 A1 Jan. 2, 2025

Related U.S. Application Data

(63) Continuation of application No. PCT/JP2022/012313, filed on Mar. 17, 2022.

(51) Int. Cl.
*G06F 8/71* (2018.01)
*G06F 9/451* (2018.01)
(Continued)

(52) U.S. Cl.
CPC .............. *G06T 11/10* (2026.01); *G06F 9/451* (2018.02); *G06F 30/31* (2020.01)

(58) Field of Classification Search
CPC ............................. G06F 3/048–05; G06F 8/71
See application file for complete search history.

(56) References Cited

U.S. PATENT DOCUMENTS 7,272,815 B1 * 9/2007 Eldridge .................. G06F 8/71 717/109
7,739,655 B1 * 6/2010 Monteiro .................. G06F 8/10 717/109
(Continued)

FOREIGN PATENT DOCUMENTS

JP 9-97277 A 4/1997
JP 11-39356 A 2/1999
(Continued)

OTHER PUBLICATIONS

Hiroaki Kuwabara et al., Coarse-Grained Frame for Replaying Editing Operation History, Computer Software [online], Oct. 25, 2013 [retrieved on Jun. 1, 2022], vol. 30, No. 4, pp. 61-66, Retrieved from: J-Stage, <DOI: https://doi.org/10.11309/jssst.30.4_61>.
(Continued)

*Primary Examiner* — Daniel Rodriguez
(74) *Attorney, Agent, or Firm* — Birch, Stewart, Kolasch & Birch, LLP

(57) ABSTRACT

A revision history replay device (100) includes a data acquisition unit (110), a replay target selection unit (120), a video creation unit (160), and a display window creation unit (180). The data acquisition unit (110) acquires version control information (31) including: a model having information of a subsystem; and a revision history of the model. The replay target selection unit (120) causes a subsystem to be selected from the model, and extracts a revision history corresponding to the subsystem from the version control information (31). The video creation unit (160) creates a video that replays a history of revision of the subsystem on a basis of the revision history corresponding to the subsystem. The display window creation unit (180) displays the video.

13 Claims, 11 Drawing Sheets

(51) Int. Cl.
*G06F 30/31* (2020.01)
*G06T 11/10* (2026.01)

(56) References Cited

U.S. PATENT DOCUMENTS

| | | | | |
|---|---|---|---|---|
| 8,667,381 | B1 * | 3/2014 | Feng | G06F 8/34 715/211 |
| 9,329,922 | B1 * | 5/2016 | McFarlane | G06F 11/0709 |
| 10,303,469 | B1 * | 5/2019 | Neatherway | G06F 8/71 |
| 2002/0099461 | A1 | 7/2002 | Anami et al. | |
| 2006/0206866 | A1 * | 9/2006 | Eldrige | G05B 15/02 717/122 |
| 2011/0055702 | A1 * | 3/2011 | Jakobson | G06T 1/00 345/473 |
| 2012/0233137 | A1 * | 9/2012 | Jakobson | G06F 3/04847 707/E17.008 |
| 2012/0271867 | A1 * | 10/2012 | Grossman | G06F 16/93 707/821 |
| 2012/0272151 | A1 * | 10/2012 | Grossman | G06F 40/197 715/772 |
| 2012/0272153 | A1 * | 10/2012 | Grossman | G06F 40/169 715/720 |
| 2012/0272173 | A1 * | 10/2012 | Grossman | G11B 27/034 715/772 |
| 2012/0272192 | A1 * | 10/2012 | Grossman | G06F 40/197 715/854 |
| 2014/0297592 | A1 | 10/2014 | Ohtake et al. | |
| 2015/0373068 | A1 * | 12/2015 | Allen | H04L 65/1069 709/204 |
| 2016/0048487 | A1 * | 2/2016 | Briggs | G06F 40/197 715/229 |
| 2016/0378734 | A1 * | 12/2016 | Mullins | G06F 3/04855 715/229 |
| 2018/0090174 | A1 * | 3/2018 | Labarre | H04N 21/47205 |
| 2021/0272023 | A1 | 9/2021 | Matsuoka et al. | |

FOREIGN PATENT DOCUMENTS

| | | | |
|---|---|---|---|
| JP | 11-175325 | A | 7/1999 |
| JP | 2001-109786 | A | 4/2001 |
| JP | 2002-288242 | A | 10/2002 |
| JP | 2006-209179 | A | 8/2006 |
| JP | 2006-235899 | A | 9/2006 |
| JP | 2008-226005 | A | 9/2008 |
| JP | 2009-116674 | A | 5/2009 |
| JP | 2014-191672 | A | 10/2014 |
| JP | 2015-162218 | A | 9/2015 |
| JP | 2016-177666 | A | 10/2016 |
| JP | 2016-177668 | A | 10/2016 |
| JP | 2018-5311 | A | 1/2018 |
| JP | 2018-163432 | A | 10/2018 |
| JP | 2018-173822 | A | 11/2018 |
| JP | 2020-86705 | A | 6/2020 |
| JP | 2021-68285 | A | 4/2021 |
| WO | WO 2019/026248 | A1 | 2/2019 |

OTHER PUBLICATIONS

International Search Report for PCT/JP2022/012313 (PCT/ISA/210) mailed on Jun. 14, 2022.

Japanese Office Action issued on Nov. 15, 2022 in the corresponding JP application No. 2022-546614.

Extended European Search Report for European Application No. 22932112.0, dated Feb. 12, 2025.

* cited by examiner

DISPLAY EXAMPLE OF REVISION HISTORY CORRESPONDING TO SUBSYSTEM

42:DISPLAY UNIT

Fig. 5

32: MODEL ALTERATION PATTERN INFORMATION

| CATEGORY | ALTERATION CONTENT |
|---|---|
| ALTERATION OF CONTROL FUNCTION | ·ADDITION OF FILTER<br>·ADDITION OF PI CONTROL |
| ALTERATION FOR CODE GENERATION | ·ALTERATION FROM VARIABLE STEP TO FIXED STEP<br>·ALTERATION FROM CONTINUOUS TIME TO DISCRETE TIME<br>·ALTERATION FROM DOUBLE TYPE TO FLOAT TYPE, FIXED-POINT NUMBER TYPE, AND BOOL TYPE |
| READABILITY IMPROVEMENT | ·UNIFICATION OF MODEL DESCRIPTION STYLE<br>·DIVISION INTO SUBSYSTEMS |

REVISION HISTORY REPLAY DEVICE, REVISION HISTORY REPLAY METHOD, AND COMPUTER READABLE MEDIUM

CROSS REFERENCE TO RELATED APPLICATION

This application is a Continuation of PCT International Application No. PCT/JP2022/012313, filed on Mar. 17, 2022, which is hereby expressly incorporated by reference into the present application.

TECHNICAL FIELD

The present disclosure relates to a revision history replay device, a revision history replay method, and a revision history replay program. Particularly, the present disclosure relates to a revision history replay device, a revision history replay method, and a revision history replay program which replay a revision history of a model in model-based development.

BACKGROUND ART

In recent product development, as processors become more sophisticated and products become more complex, engineering for improving safety and performance of the products is becoming more complex. In order to accomplish this complex engineering, a development technique called model-based development which uses a model is employed. Here, a model refers to a model used in SysML which is a system modeling language, or a block diagram used in fields such as circuit design. Note that SysML stands for Systems Modeling Language.

In the model-based development described above, at the design stage of a general product development technique, document-based design is not performed but model-based design is performed. Therefore, communication via models occurs between engineers who specialize in hardware and engineers who specialize in software.

In this communication via models, a person other than a designer of a model does not have sufficient knowledge of the model. Accordingly, it is difficult for the person other than the designer to recognize what perspective the model was designed and verified from. Further, in a model design process, the model is designed in detail step by step. For this reason, it is difficult for the person other than the designer to understand the intention of the design when he or she looks at a design-completed model and follows the flow of detailed designing in a reverse order. Hence, it is difficult for the person other than the designer to acquire know-how on his or her own.

Concerning a block diagram having a plurality of subsystems, a block diagram management device is available which facilitates recognition of difference information between before and after alteration. With this block diagram management device, a technique is disclosed which generates difference information from subsystems in each layer, color-codes all the difference information, synthesizes the color-coded difference information, and displays the synthesis result.

However, this block diagram management device only displays a difference produced by a single alteration of the block diagram by comparing "before change" and "after change". Also, when a person other than the designer tries to read a revision history of a model, it is not apparent which time series to follow. Therefore, it is difficult for the person other than the designer to get a bird's-eye view of how the model has been altered.

Patent Literature 1 discloses a model management device which can grasp alteration contents of a model in model-based development without using a dedicated development tool.

CITATION LIST

Patent Literature

Patent Literature 1: JP 2018-173822 A

SUMMARY OF INVENTION

Technical Problem

The management device disclosed in Patent Literature 1 displays alteration contents of a model by comparing a model before alteration with a model after alteration. This is how the management device of Patent Literature 1 supports non-specialist developers in understanding the alteration contents of the model. However, there is a problem that the management device only displays the alteration contents and cannot facilitate understanding of the intention of alteration.

The present disclosure has as its objective to facilitate understanding of a designer's intention in a model alteration by using a model revision history.

Solution to Problem

A revision history replay device according to the present disclosure includes:

- a data acquisition unit to acquire version control information including: a model having information of a subsystem; and a revision history of the model;
- a replay target selection unit to cause a subsystem to be selected from the model, and to extract a revision history corresponding to the subsystem from the version control information;
- a video creation unit to create a video that replays a history of revision of the subsystem on a basis of the revision history corresponding to the subsystem; and
- a display window creation unit to display the video.

Advantageous Effects of Invention

A revision history replay device according to the present disclosure displays a video that replays a history of revision of a subsystem selected by a user. Therefore, the revision history replay device according to the present disclosure achieves an effect of enabling the user to easily understand an intension of an alteration made to a model by a designer.

BRIEF DESCRIPTION OF DRAWINGS

FIG. 5 is a diagram illustrating a configuration example of model alteration pattern information according to Embodiment 1.

DESCRIPTION OF EMBODIMENTS

Figure 1:
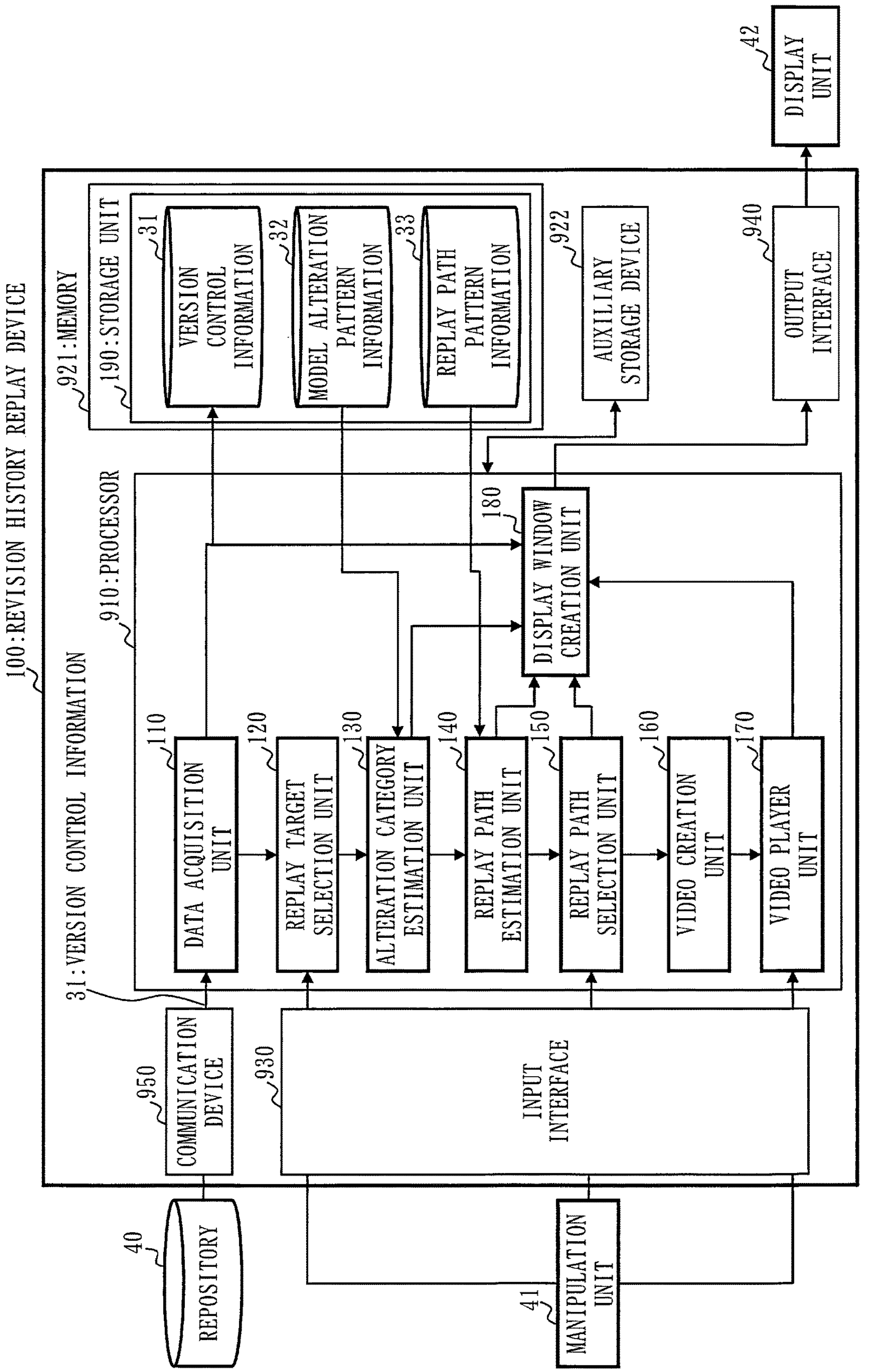
FIG. 1 is a diagram illustrating a configuration example of a revision history replay device according to Embodiment 1.

A present embodiment will be described below with referring to drawings. In the drawings, the same or equivalent portions are denoted by the same reference sign. In the embodiment, description of the same or equivalent portions will be arbitrarily omitted or simplified. Arrows in the drawings mainly express data flows or process flows.

Embodiment 1

Description of Configurations

FIG. 1 is a diagram illustrating a configuration example of a revision history replay device 100 according to the present embodiment.

The revision history replay device 100 is a computer. The revision history replay device 100 is provided with a processor 910 as well as other hardware devices such as a memory 921, an auxiliary storage device 922, an input interface 930, an output interface 940, and a communication device 950. The processor 910 is connected to the other hardware devices via a signal line and controls the other hardware devices.

The revision history replay device 100 is provided with a data acquisition unit 110, a replay target selection unit 120, an alteration category estimation unit 130, a replay path estimation unit 140, a replay path selection unit 150, a video creation unit 160, a video player unit 170, a display window creation unit 180, and a storage unit 190, as function elements. Version control information 31, model alteration pattern information 32, and replay path pattern information 33 are stored in the storage unit 190.

Functions of the data acquisition unit 110, replay target selection unit 120, alteration category estimation unit 130, replay path estimation unit 140, replay path selection unit 150, video creation unit 160, video player unit 170, and display window creation unit 180 are implemented by software. The storage unit 190 is provided to the memory 921. Note that the storage unit 190 may be provided to the auxiliary storage device 922, or to the memory 921 and the auxiliary storage device 922 by distribution. The processor 910 is a device that runs a revision history replay program.

The revision history replay program is a program that implements the functions of the data acquisition unit 110, replay target selection unit 120, alteration category estimation unit 130, replay path estimation unit 140, replay path selection unit 150, video creation unit 160, video player unit 170, and display window creation unit 180.

The processor 910 is an IC that performs computation processing. Specific examples of the processor 910 are a CPU, a DSP, and a GPU. Note that IC stands for Integrated Circuit, CPU for Central Processing Unit, DSP for Digital Signal Processor, and GPU for Graphics Processing Unit.

The memory 921 is a storage device that stores data temporarily. A specific example of the memory 921 is an SRM or a DRAM. Note that SRAM stands for Static Random-Access Memory, and DRAM for Dynamic Random-Access Memory.

The auxiliary storage device 922 is a storage device that keeps data. A specific example of the auxiliary storage device 922 is an HDD. The auxiliary storage device 922 may be a portable storage medium such as an SD (registered trademark) memory card, a CF, a NAND flash, a flexible disk, an optical disk, a compact disk, a Blu-ray (registered trademark) disc, and a DVD. Note that HDD stands for Hard Disk Drive, SD (registered trademark) for Secure Digital, CF for CompactFlash (registered trademark), and DVD for Digital Versatile Disk.

The input interface 930 is a port to be connected to an input device such as a mouse, a keyboard, and a touch panel. The input device is, for example, a manipulation unit 41. The input interface 930 is specifically a USB terminal. Note that the input interface 930 may be a port to be connected to a LAN. Note that USB stands for Universal Serial Bus, and LAN for Local Area Network. In FIG. 1, as the input interface 930, only one is illustrated, but there may be a plurality of input interfaces 930.

The output interface 940 is a port to which a cable of an output apparatus such as a display is to be connected. The output apparatus is, for example, a display unit 42. The output interface 940 is specifically a USB terminal or an HDMI (registered trademark) terminal. The display is specifically an LCD. The output interface 940 is also called display unit interface. Note that HDMI (registered trademark) stands for High-Definition Multimedia Interface, and LCD for Liquid Crystal Display. In FIG. 1, as the output interface 940, only one is illustrated, but there may be a plurality of output interfaces 940.

The communication device 950 has a receiver and a transmitter. The communication device 950 is connected to a communication network such as a LAN, the Internet, and a telephone line. The communication device 950 is specifically a communication chip or an NIC. The communication device 950 may have a role of a communication network that acquires information in a wireless manner. Note that NIC stands for Network Interface Card.

The revision history replay program runs in the revision history replay device 100. The revision history replay program is read by the processor 910 and run by the processor 910. Not only the revision history replay program but also an OS is stored in the memory 921. Note that OS stands for Operating System. The processor 910 runs the revision history replay program while running the OS. The revision history replay program and the OS may be stored in the auxiliary storage device 922. The revision history replay program and the OS which are stored in the auxiliary storage device 922 are loaded to the memory 921 and run by the processor 910. The revision history replay program may be incorporated in the OS partly or entirely.

The revision history replay device 100 may be provided with a plurality of processors that substitute for the processor 910. The plurality of processors share running of the revision history replay program. Each processor is a device that runs the revision history replay program just as the processor 910 does.

Data, information, signal values, and variable values which are used, processed, or outputted by the revision history replay program are stored in the memory 921, the auxiliary storage device 922, or a register or cache memory in the processor 910.

The word "unit" in each of the terms: data acquisition unit 110; replay target selection unit 120; alteration category estimation unit 130; replay path estimation unit 140; replay path selection unit 150; video creation unit 160; video player unit 170; and display window creation unit 180, may be replaced by "circuit", "stage", "procedure", "process", or "circuitry". The revision history replay program causes the computer to execute a data acquisition process, a replay target selection process, an alteration category estimation process, a replay path estimation process, a replay path selection process, a video creation process, a video player process, and a display window creation process. The word "process" in each of the terms: data acquisition process; replay target selection process; alteration category estimation process; replay path estimation process; replay path selection process; video creation process; video player process; and display window creation process, may be replaced by "program", "program product", "program-stored computer readable storage medium", or "program-recorded computer readable recording medium". A revision history replay method is a method that is carried out by the revision history replay device 100 running the revision history replay program.

The revision history replay program may be stored in a computer readable recording medium and presented. Alternatively, the revision history replay program may be presented in the form of a program product.

Description of Functions

Each function element, each information, and functions of the input and output devices will now be described.

Each function element is provided with a software module that implements a function to be described below.

For example, a following description "the data acquisition unit 110 acquires version control information 31 of a model" signifies that "the data acquisition unit 110 is provided with a software module that acquires version control information 31 of a model".

The data acquisition unit 110 acquires version control information 31 of a model. The model has a subsystem. The version control information 31 of the model includes the model and a revision history of the model.

For example, the data acquisition unit 110 acquires the version control information 31 of the model from an external repository 40. The data acquisition unit 110 outputs the version control information 31 of the model to the display window creation unit 180.

The replay target selection unit 120 effects selection of a subsystem from the model and extracts a revision history corresponding to the subsystem from the version control information 31. The revision history corresponding to the subsystem is a history of revision in the subsystem. Each alteration in the subsystem is also called a commit.

The replay target selection unit 120 accepts from the manipulation unit 41 a system selected by the user out of the model. Also, the replay target selection unit 120 extracts from the model version control information 31 a revision history corresponding to the subsystem accepted from the manipulation unit 41. In addition, the replay target selection unit 120 outputs to the alteration category estimation unit 130 the extracted revision history corresponding to the subsystem.

The alteration category estimation unit 130 classifies the revision history corresponding to the subsystem into a category according to an alteration content, and outputs the category-classified revision history corresponding to the subsystem as alteration category information.

The alteration category estimation unit 130 acquires, from the model alteration pattern information 32, data for classifying by category the revision history corresponding to the subsystem. Then, the alteration category estimation unit 130 classifies the revision history corresponding to the subsystem with referring to the data acquired from the model alteration pattern information 32. Furthermore, the alteration category estimation unit 130 outputs the alteration category information obtained by the classification to the display window creation unit 180. In addition, the alteration category estimation unit 130 outputs the revision history corresponding to the subsystem, and the alteration category information, to the replay path estimation unit 140.

The replay path estimation unit 140 estimates a replay path per category on a basis of the revision history corresponding to the subsystem and on a basis of the alteration category information, and outputs replay path information obtained by the estimation.

The replay path estimation unit 140 acquires, from the replay path pattern information 33, data for deriving a replay path of a video. The replay path estimation unit 140 also estimates the replay path with referring to the revision history corresponding to the subsystem and accepted from the alteration category estimation unit 130, the alteration category information accepted from the alteration category estimation unit 130, and the data acquired from the replay path pattern information 33. Furthermore, the replay path estimation unit 140 outputs the replay path information obtained by the estimation to the display window creation unit 180. In addition, the replay path estimation unit 140 outputs the revision history corresponding to the subsystem, the alteration category information, and the replay path information, to the replay path selection unit 150.

The replay path selection unit 150 causes a replay path for replaying the history of revision of the subsystem, to be selected on a basis of the revision history corresponding to the subsystem. Specifically, the replay path selection unit 150 causes the user to select the replay path for replaying the history of revision of the subsystem, from the replay path information.

The replay path selection unit 150 accepts from the manipulation unit 41 the replay path selected by the user from the replay path information. The replay path selection unit 150 also outputs the accepted replay path to the display window creation unit 180. Furthermore, the replay path selection unit 150 extracts, from the revision history corresponding to the subsystem, a revision history included in a section of the accepted replay path, as a replay path revision history. In addition, the replay path selection unit 150 outputs the extracted replay path revision history, the alteration category information, and the accepted replay path to the video creation unit 160.

The video creation unit 160 creates a video that replays the history of revision of the subsystem on a basis of the revision history corresponding to the subsystem. Specifically, the video creation unit 160 creates the video that replays the history of revision of the subsystem along the replay path. In the following, an alteration may be called a commit.

The video creation unit 160 extracts alteration in parameters and diagrams in each commit with referring to the accepted replay path revision history, and creates revision history window information of each commit. The video creation unit 160 also creates a video with referring to the revision history window information of each commit. Furthermore, the video creation unit 160 creates a seek bar with referring to the accepted alteration category information and the replay path. In addition, the video creation unit 160 outputs the created video and seek bar to the video player unit 170. In addition, the video creation unit 160 extracts an action, an action log, and an action result image which are included in the replay path revision history, with referring to the replay path revision history and the alteration category information. The action mentioned here is extracted with referring to logs such as execution of a simulation, code generation, and test generation creation which are included in the replay path revision history.

The video player unit 170 manipulates the video created by the video creation unit 160.

The video player unit 170 replays and stops the accepted video. The video player unit 170 also executes an operation selected in the manipulation unit 41 by the user, and outputs operation information of that time to the display window creation unit 180. A specific operation selected by the user is replaying and stopping the video, or manipulating the seek bar. In response to the seek bar manipulation, window information to be outputted to the display window creation unit 180 changes.

The display window creation unit 180 displays the video to the display unit 42. The display window creation unit 180 outputs a window of the model version control information 31 accepted from the data acquisition unit 110 to the display unit 42. The display window creation unit 180 also synthesizes the alteration category information accepted from the alteration category estimation unit 130 with the model version control information 31 by color coding, and outputs a window of the synthesis result to the display unit 42. In addition, the display window creation unit 180 synthesizes the replay path information accepted from the replay path estimation unit 140 with the model version control information 31 by color coding, and outputs a window of the synthesis result to the display unit 42. In addition, the display window creation unit 180 synthesizes the replay path accepted from the replay path selection unit 150 with the model version control information 31 by color coding, and outputs a window of the synthesis result to the display unit 42. In addition, the display window creation unit 180 outputs window information that matches the operation to the display unit 42 with referring to the operation information accepted from the video player unit 170. The window information mentioned here that matches the operation is, if replay of the video is in execution, an operation of communicating the video to the display unit 42; and is, if stop is selected, an operation of communicating a video stop window to the display unit 42.

The model alteration pattern information 32 is information in which an alteration category and an alteration content are associated with each other.

The model alteration pattern information 32 is a group of data for classifying the revision history within the model version control information 31. The group of data mentioned here for classifying the revision history is, for example, if the classification pattern is code readability improvement, data for classifying an alteration such as alteration of a space or indent and an alteration of a variable name or function name.

The replay path pattern information 33 is a group of data for classifying the replay path within the version control information 31. For example, if the path is to replay only an alteration that is essential in the design stage, the replay path pattern information 33 is used for adding a block diagram, or for performing path search by focusing on an alteration amount of a parameter.

For example, the replay path pattern information 33 is used for estimating a replay path for replaying a history of revision of a subsystem under a particular condition. The replay path pattern information 33 is information in which an evaluation axis of an alteration, namely of a commit, for estimating a replay path is set. The particular condition will be described later.

The version control information 31 consists of files of system models and a group of data of difference information of system models of the individual revision histories. For example, the version control information 31 is acquired from the repository 40 of Git being a typical version control system.

The manipulation unit 41 is a hardware device for manipulating the replay target selection unit 120, replay path selection unit 150, and video player unit 170 in the revision history replay device 100. For example, the manipulation unit 41 uses a mouse. Note that the manipulation unit 41 may employ a keyboard, a touch panel, a touch pad, a track ball, a pen tablet, or any other pointing device.

The display unit 42 is a hardware device which, when using the revision history replay device 100, accepts information of a display window created by the display window creation unit 180 and outputs the window of that information. For example, the display unit 42 uses a display. Note that the display unit 42 may use an LCD, a CRT, or any other display device. Note that CRT stands for Cathode Ray Tube.

Description of Operations

Operations of the revision history replay device 100 according to the present embodiment will now be described. An operation procedure of the revision history replay device 100 corresponds to the revision history replay method. A program that implements the operations of the revision history replay device 100 corresponds to the revision history replay program.

Figure 2:
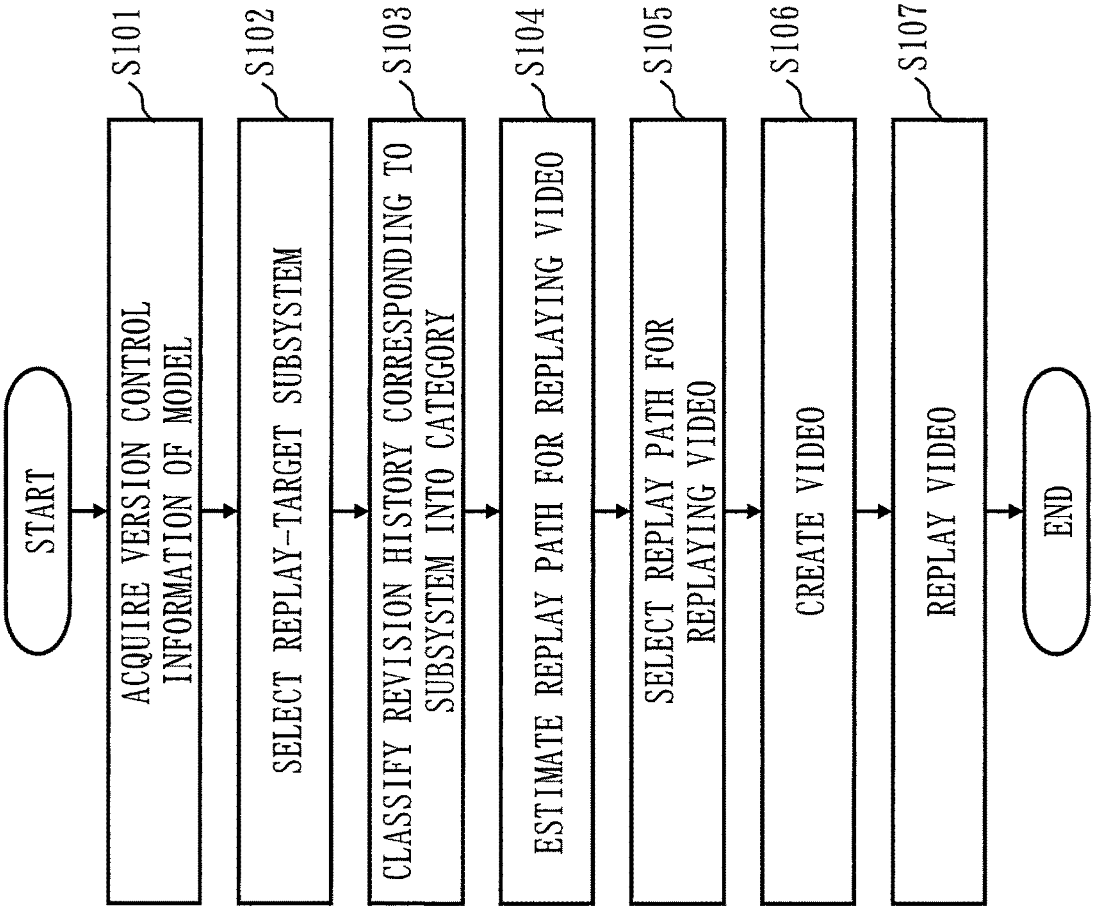
FIG. 2 is a flowchart illustrating a process of the revision history replay device according to Embodiment 1.

FIG. 2 is a flowchart illustrating a process of the revision history replay device 100 according to the present embodiment.

<Data Acquisition Process: S101>

In step S101, the data acquisition unit 110 acquires the version control information 31 of the model from the repository 40. The version control information 31 includes a revision history of the model having a subsystem.

Specifically, the user uses the revision history replay device 100 to select a model whose video is to be replayed. The data acquisition unit 110 acquires the version control information 31 corresponding to the selected model from the repository 40. Also, the data acquisition unit 110 outputs the version control information 31 of the acquired model to the display unit 42 via the display window creation unit 180.

<Replay Target Selection Process: S102>

In step S102, the replay target selection unit 120 causes the subsystem to be selected from the model, and extracts a revision history corresponding to the subsystem from the version control information 31.

Specifically, the user checks the display unit 42 displaying the model version control information 31. Then, the user selects the subsystem whose video is to be created, from the display unit 42 via the manipulation unit 41.

Figure 3:
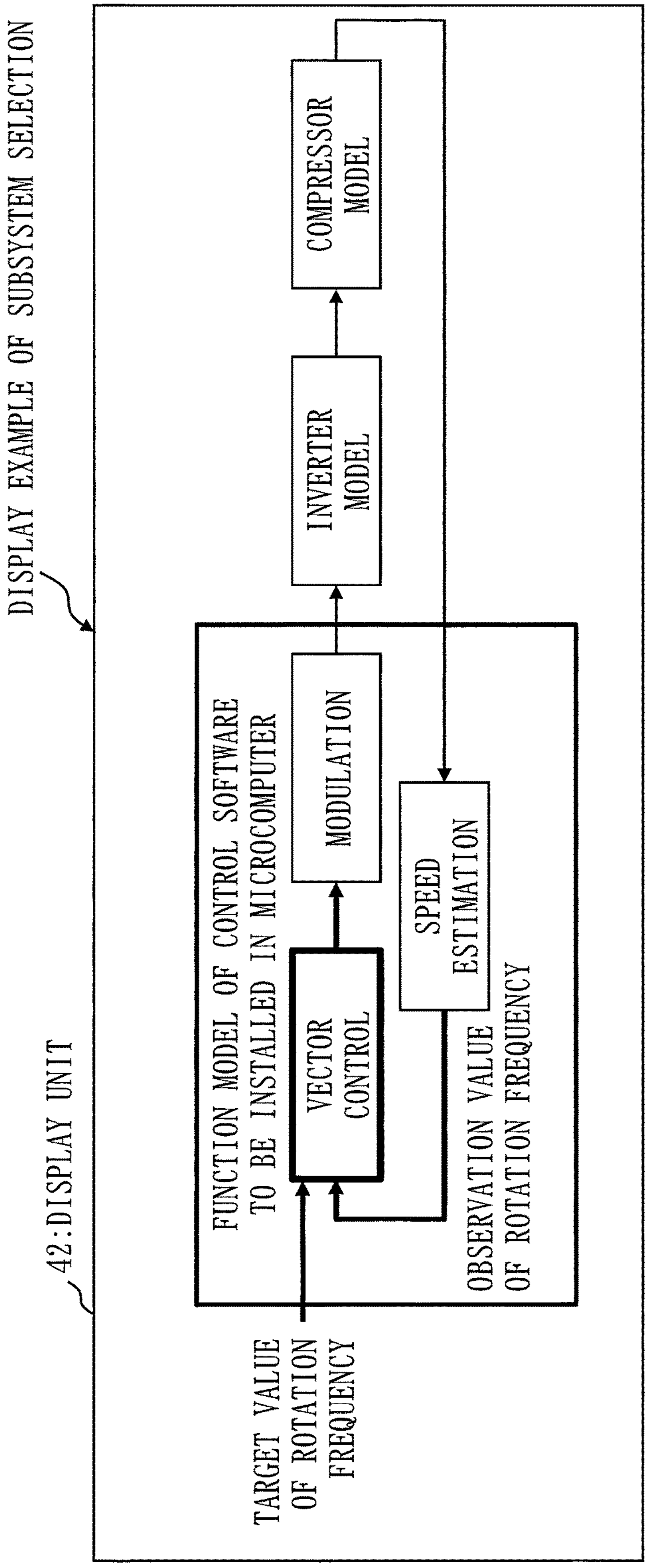
FIG. 3 is a diagram illustrating a model display example according to Embodiment 1.

FIG. 3 is a diagram illustrating a model display example according to the present embodiment.

Figure 4:
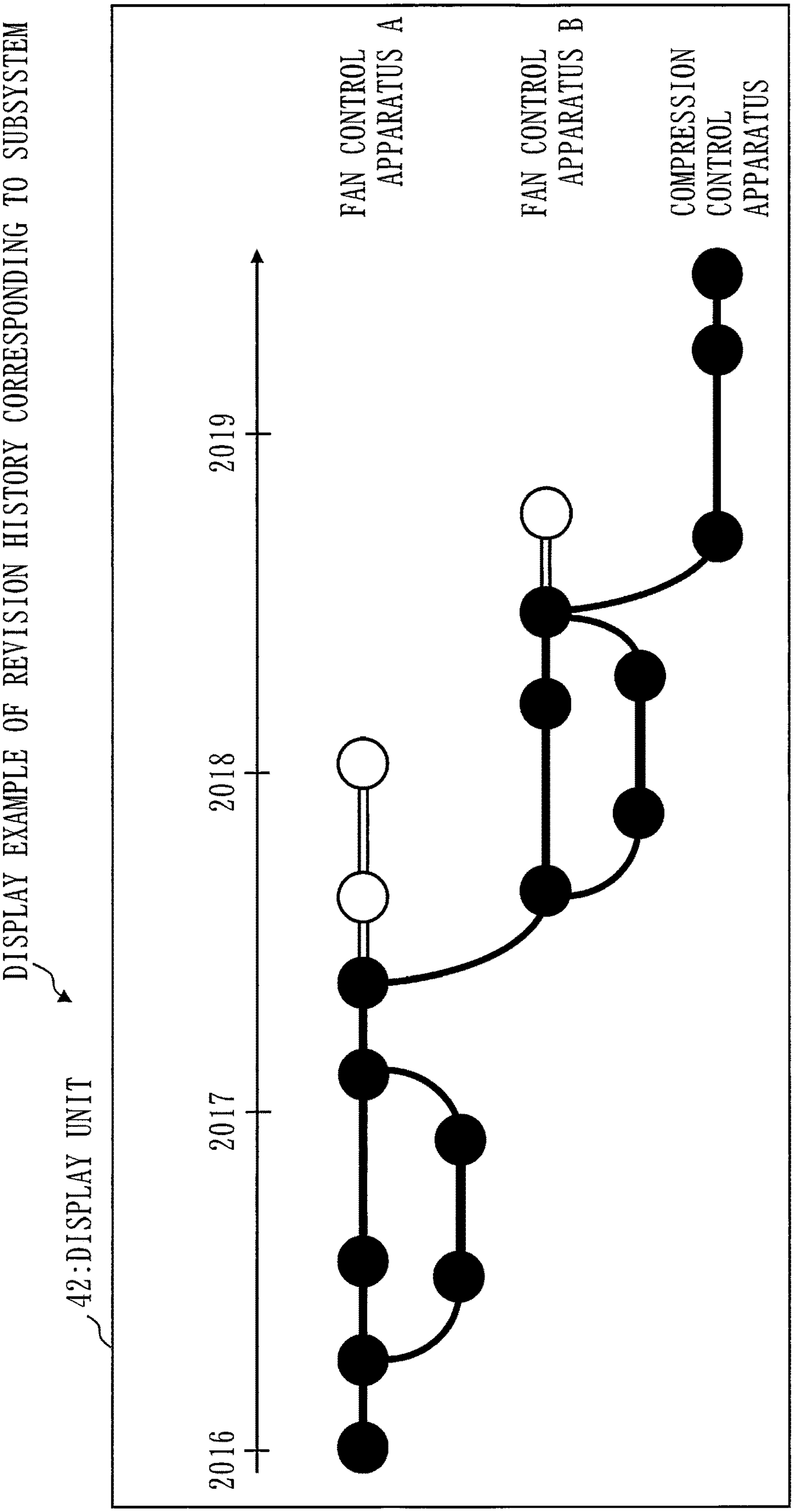
FIG. 4 is a diagram illustrating a display example of model version control information according to Embodiment 1.

FIG. 4 is a diagram illustrating a display example of the model version control information 31 according to the present embodiment.

FIG. 3 displays the model selected in step S101, and illustrates how the replay-target subsystem is selected by the user. Specifically, FIG. 3 displays how "vector control" which is a subsystem is selected from "a function model of control software to be installed in a microcomputer" which is a model.

FIG. 4 displays a revision history of the subsystem selected in FIG. 3. In FIG. 4, each alteration is expressed by a circle. The alteration expressed by the circle is called a commit.

<Alteration Category Estimation Process: S103>

In step S103, the alteration category estimation unit 130 classifies the revision history corresponding to the subsystem into a category according to an alteration content, and outputs the category-classified revision history corresponding to the subsystem, as the alteration category information 34.

Specifically, the alteration category estimation unit 130 classifies the revision history corresponding to the replay-target subsystem by category with referring to the model alteration pattern information 32. For example, if the revision history corresponding to the replay-target subsystem includes an alteration, namely a commit, that mainly aims to correct code readability, the alteration category estimation unit 130 classifies this commit into a readability improvement category. The alteration category estimation unit 130 synthetizes the commit with the model version control information 31 by color coding in accordance with the category, and outputs the synthesis result to the display window creation unit 180.

FIG. 5 is a diagram illustrating a configuration example of the model alteration pattern information 32 according to the present embodiment.

In the model alteration pattern information 32, the category and the alteration content are associated with each other.

The alteration category estimation unit 130 classifies the revision history corresponding to the subsystem into the category according to the alteration content on a basis of the model alteration pattern information 32. That is, the alteration category estimation unit 130 classifies the revision history corresponding to the subsystem by automatic estimation by category with referring to the model alteration pattern information 32.

In the automatic estimation, a technique such as deep learning may be used.

In the model alteration pattern information 32, what alteration is classified into what category is defined in advance.

For example, if the revision history corresponding to the subsystem includes an alteration that mainly aims to correct code readability, the alteration category estimation unit 130 classifies that alteration into the readability improvement category. Then, the alteration category estimation unit 130 color-codes the commit of the revision history corresponding to the subsystem by category.

More specifically, on a basis of the model alteration pattern information 32, if the revision history corresponding to the subsystem includes a commit with an alteration content such as "unification of model description style", the alteration category estimation unit 130 classifies this commit as belonging to the "readability improvement" category.

Figure 6:
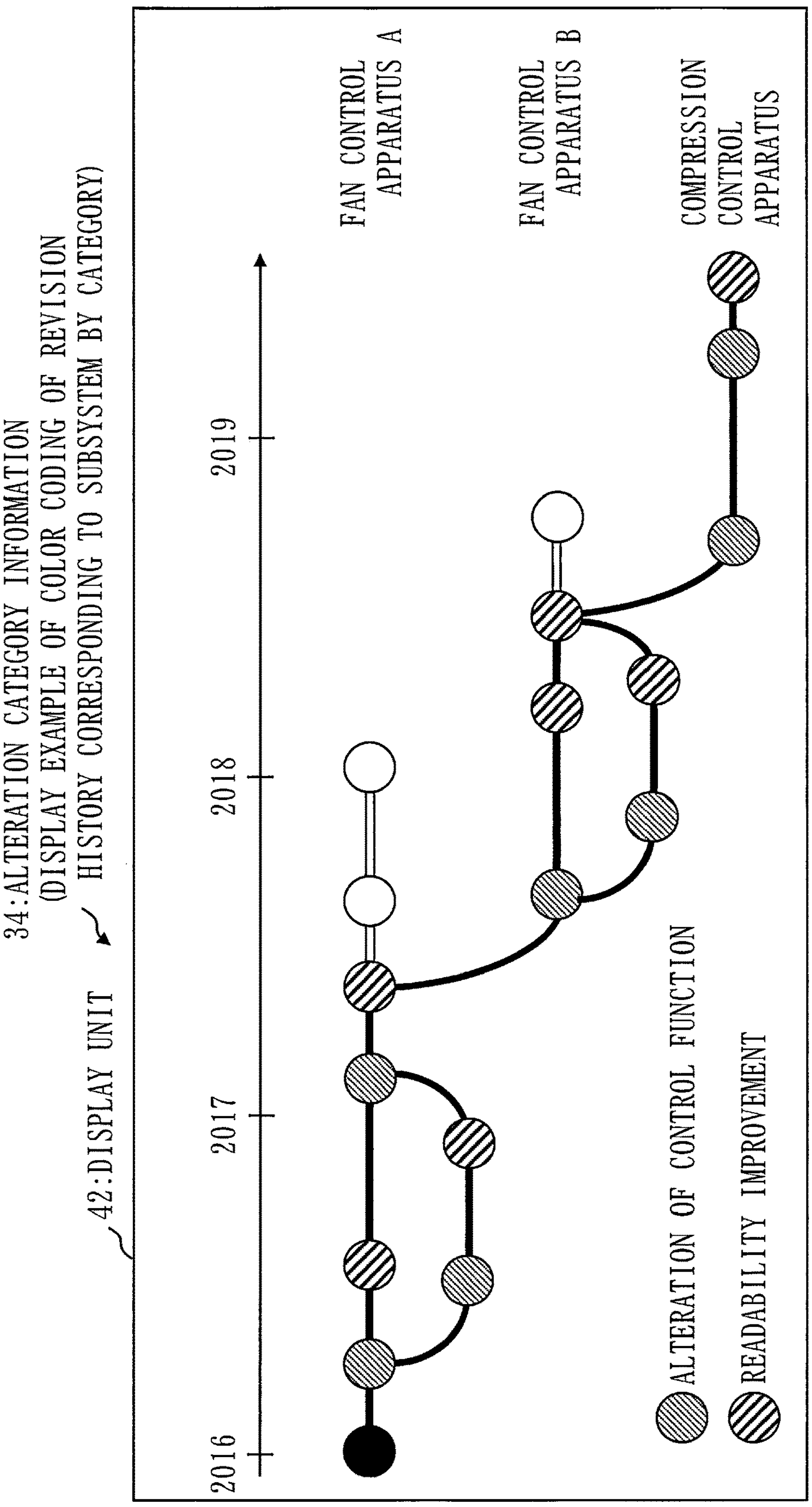
FIG. 6 is a diagram illustrating a display example of alteration category information by an alteration category estimation process according to Embodiment 1.

FIG. 6 is a diagram illustrating a display example of the alteration category information 34 by an alteration category estimation process according to the present embodiment.

FIG. 6 illustrates the alteration category information 34 in which the revision history corresponding to the subsystem is color-coded by the alteration category estimation process in accordance with the category.

In FIG. 6, a commit of the revision history corresponding to the subsystem is color-coded under either a "control function alteration" category or the "readability improvement" category.

<Alteration Path Estimation Process: S104>

In step S104, the replay path estimation unit 140 estimates a replay path per category on a basis of the revision history corresponding to the subsystem and on a basis of the alteration category information 34, and outputs replay path information obtained by the estimation.

Specifically, the replay path estimation unit 140 estimates the replay path per category with referring to the revision history corresponding to the subsystem, the alteration category information, and the replay path pattern information 33. Out of the alteration category information, the replay path estimation unit 140 extracts only commits of a subsystem classified into one category. For example, the replay path estimation unit 140 extracts only commits in the revision history corresponding to a subsystem classified into alteration of the control function. Hence, the replay path estimation unit 140 can estimate a replay path where only the control function has been altered.

The replay path estimation unit 140 also evaluates each alteration, namely each commit, of the revision history corresponding to the subsystem on a basis of the replay path pattern information 33, so that a replay path including an alteration point essential for understanding the intension of the design can be estimated per category.

The replay path pattern information 33 is used when estimating the replay path under a particular condition. The replay path pattern information 33 includes information in which an evaluation axis of an alteration, namely a commit, in estimating the replay path is set.

The replay path pattern information 33 has, as data, an evaluation axis or pattern used when executing estimation of a replay path by focusing on the alteration category among commits of the subsystem. The replay path pattern information 33 may include a definition as to what alteration, namely what commit, is essential in the category as a replay path of a video.

The replay path estimation unit 140 automatically estimates a replay path that includes an alteration essential for understanding the intension of the design, by referring to the replay path pattern information 33 and the alteration category information.

This automatic estimation may employ a technique such as deep learning.

A more specific description will be made below on a method of estimating a replay path including an alteration point essential for understanding the intension of the design per category, with using the replay path pattern information 33.

Basically, a particular commit categorized by the alteration category information 34 is extracted, so it is possible to recommend to the user a replay path that facilitates communication of the intension of an alteration. However, under a particular condition as follows, the replay path estimation unit 140 estimates a replay path with using the replay path pattern information 33.

(1) A case where a recommendable replay path cannot be determined uniquely when a particular commit is extracted.

(2) A case where a function defined once is altered and then restored to the originally defined function.

Figure 7:
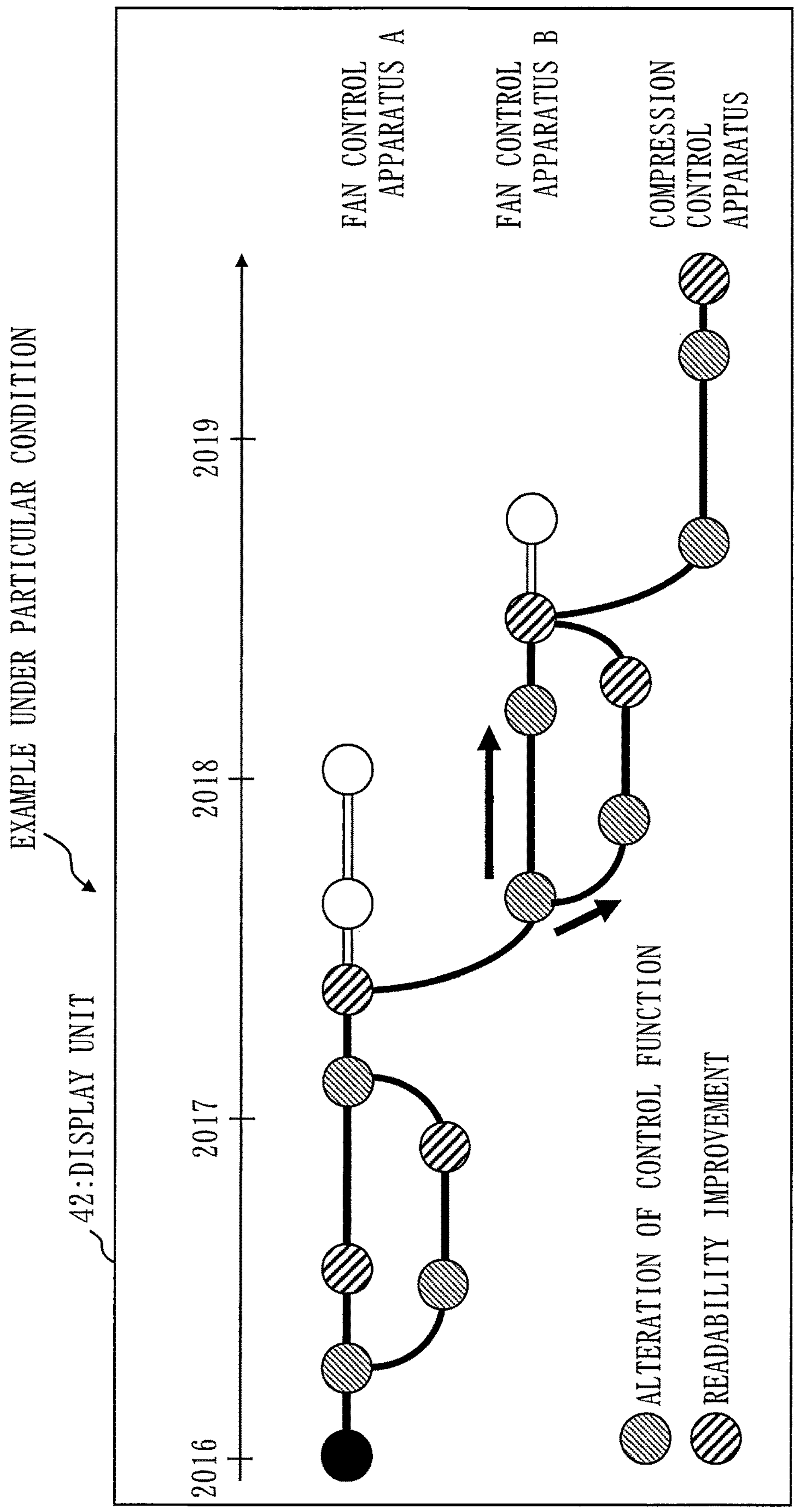
FIG. 7 is a diagram illustrating an example under a particular condition where a replay path estimation unit according to Embodiment 1 estimates a replay path with using replay path pattern information.

FIG. 7 is a diagram illustrating an example under a particular condition where the replay path estimation unit 140 according to the present embodiment estimates a replay path with using the replay path pattern information 33.

The above case (1) will be described.

For example, assume that commits categorized as "alteration of a control function" exist among commits of a fan control apparatus B over a plurality of paths, as illustrated in FIG. 7. In this case, the replay path pattern information 33 is used in estimating one path.

For example, the replay path pattern information 33 has a preset content "determination cannot be made uniquely, estimate a replay path having fewer commits". The replay path estimation unit 140 estimates a replay path uniquely in accordance with the above content in the replay path pattern information 33.

Figure 8:
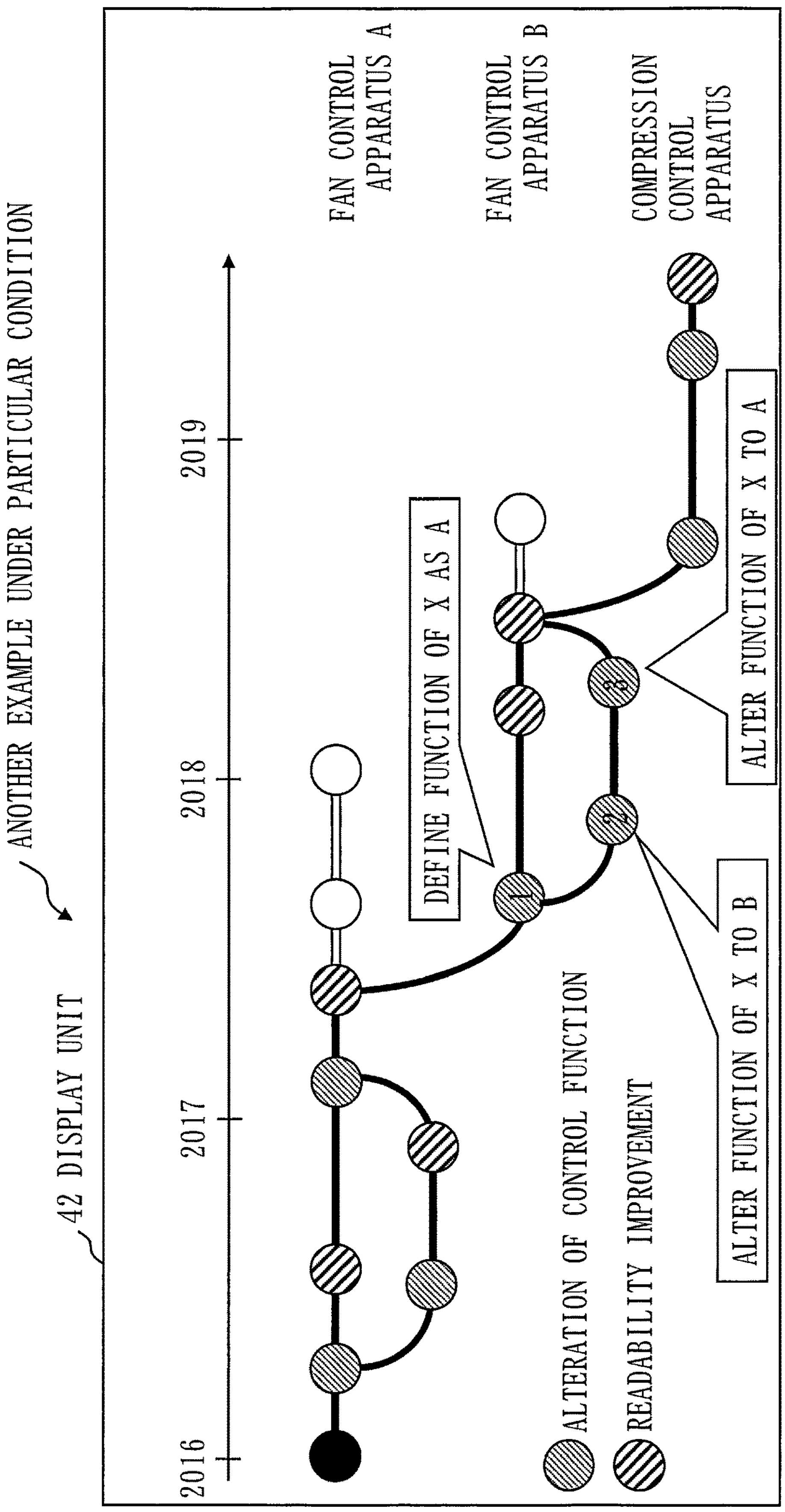
FIG. 8 is a diagram illustrating another example under the particular condition where the replay path estimation unit according to Embodiment 1 estimates a replay path with using the replay path pattern information.

FIG. 8 is a diagram illustrating another example under the particular condition where the replay path estimation unit 140 according to the present embodiment estimates a replay path with using the replay path pattern information 33.

For example, assume that a content that has been altered to "define function of X as A" by commit 1 of the fan control apparatus B is altered into "alter function of X to B" by commit 2, as illustrated in FIG. 8. In this case, if the altered content is altered by commit 3 to "alter function of X to A", the function of X is restored to A. In this manner, when a commit of a particular category "alteration of the control function" is extracted on a basis of the alteration category information 34, a replay path including these commits 1 to 3 is estimated. If, however, the function X does not change between commit 1 and commit 3, presenting a change may undesirably interfere with the user's understanding the intension of model alteration. Hence, by using the replay path pattern information 33, it is possible to estimate a path that is easier for the user to understand.

For example, the replay path pattern information 33 has a preset content "when a function defined once is altered and restored to the originally defined function, omit intermediate commits (commits 2 and 3 of FIG. 8)". The replay path estimation unit 140 estimates a replay path in accordance with the above content in the replay path pattern information 33.

The replay path pattern information 33 has preset evaluation axes of commits of a replay path that should be avoided, and preset evaluation axes of commits of a replay path that should be selected.

The evaluation axes of the commits of the replay path that should be avoided are as follows.

Many commits are involved. As a content (function and interface) which the video finally reaches stays the same, the fewer the commits, the better.

Few commits are involved. When a plurality of alterations are made in one commit, the replay path looks simplified but a leap in logic becomes large. Then, the design intention becomes elusive.

To facilitate understanding of the design intention, a replay path that includes the following commits should be selected. The evaluation axes of the commits of the replay path that should be selected are as follows.

Many comments, namely, many explanations, concerning functions are involved.

Many action results or action logs are involved.

When evaluation of each commit and evaluation of each replay path (total evaluation of all commits to be selected from) are performed with referring to the evaluation axes of the commits that should be avoided and the evaluation axes of the commits that should be selected, it is possible to estimate a good replay path and a bad replay path.

Furthermore, the replay path estimation unit 140 synthesizes replay path information obtained by estimation with the model version control information 31 by color coding, and outputs the synthesis result to the display window creation unit 180.

Specifically, as the replay path information, a plurality of replay paths are displayed by the display window creation unit 180. For example, as the replay path information, a replay path of control function alteration and a replay path of readability improvement are displayed.

<Alteration Path Selection Process: S105>

In step S105, the replay path selection unit 150 causes a replay path for replaying a history of revision of a subsystem, to be selected from the replay path information accepted from the replay path estimation unit 140.

Specifically, the replay path selection unit 150 accepts a replay-target replay path selected by the user, with the manipulation unit 41. The user checks the display unit 42 displaying the model version control information 31, and selects a path that replays the video, from the model version control information 31 through the manipulation unit 41.

Figure 9:
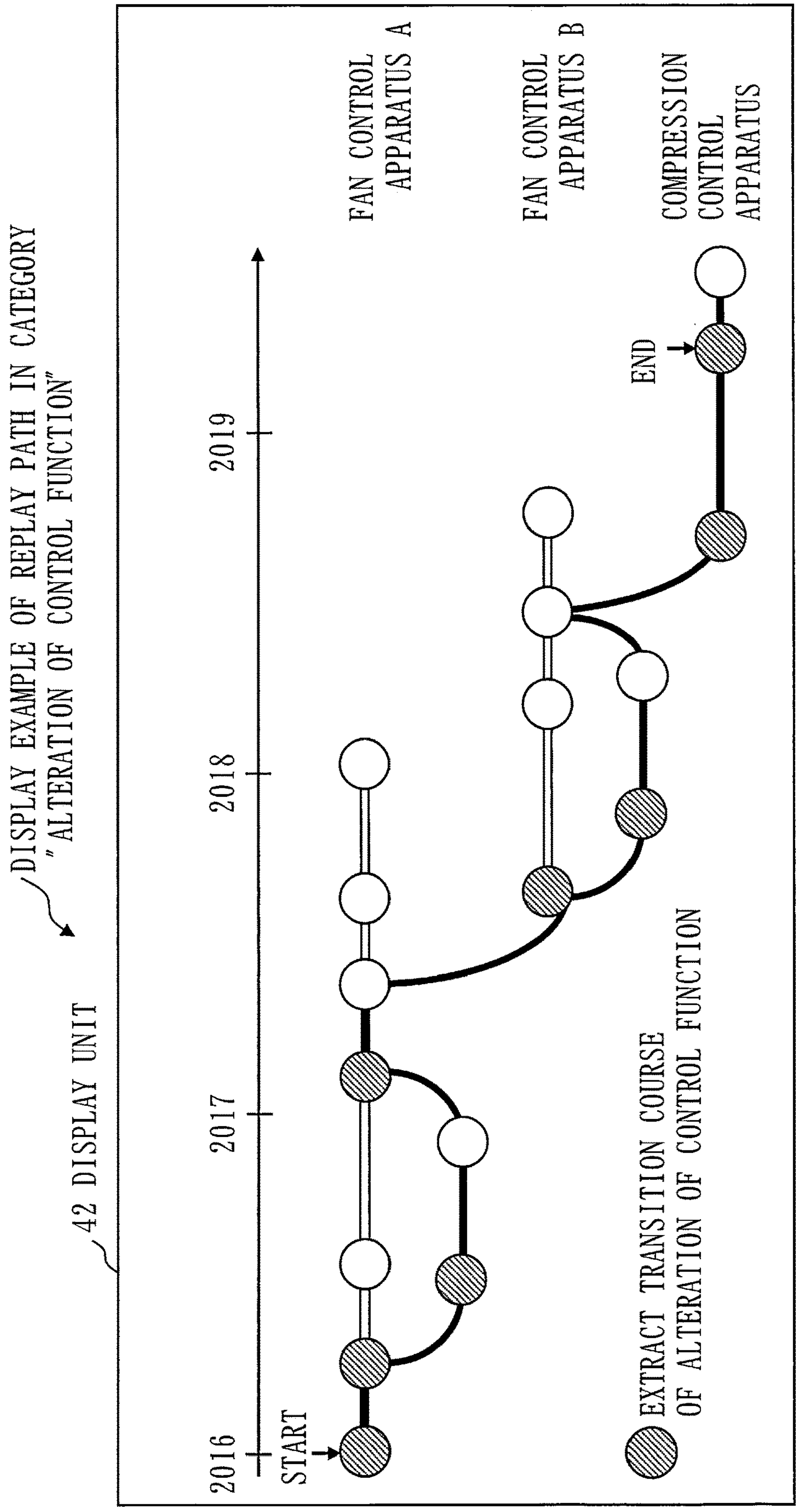
FIG. 9 is a diagram illustrating a display example of an alteration path estimation process according to Embodiment 1.

FIG. 9 is a diagram illustrating a display example of an alteration path estimation process according to the present embodiment.

FIG. 9 illustrates a replay path in the category "control function alteration".

The replay path selection unit 150 may have a function according to which the user moves a start position and an end position so as to designate the replay path in more detail, as illustrated in FIG. 9.

<Video Creation Process: S106>

In step S106, the video creation unit 160 creates a video that replays a history of revision of the subsystem on a basis of the revision history corresponding to the subsystem. Specifically, the video creation unit 160 creates a video that replays a history of revision of the subsystem along the replay path.

The video creation unit 160 extracts alterations in parameters and diagrams in each commit with referring to the accepted replay path revision history, and creates revision history window information of each commit. The video creation unit 160 also creates a video with referring to the revision history window information of each commit. Furthermore, the video creation unit 160 creates a seek bar with referring to the accepted alteration category information and the replay path. In addition, the video creation unit 160 outputs the created video and the created seek bar to the video player unit 170 as video information. In addition, the video creation unit 160 extracts an action, an action log, and an action result image which are included in the replay path revision history, with referring to the replay path revision history and the alteration category information. The action mentioned here is extracted with referring to logs such as execution of a simulation, code generation, and test generation which are included in the replay path revision history.

<Video Player Process: S107>

In step S107, the video player unit 170 accepts vide information from the video creation unit 160. The video player unit 170 also instructs the display window creation unit 180 to display a video player window. Furthermore, the video player unit 170 accepts replay button information from the manipulation unit 41 and instructs the display window creation unit 180 to replay the video. Specifically, the user checks the display unit 42 which displays the video player window, and depresses a replay button or stop button in the window so as to replay or stop the video via the manipulation unit 41. Also, the video player unit 170 accepts seek bar movement information from the manipulation unit 41 and instructs the display window creation unit 180 to replay the video.

Figure 10:
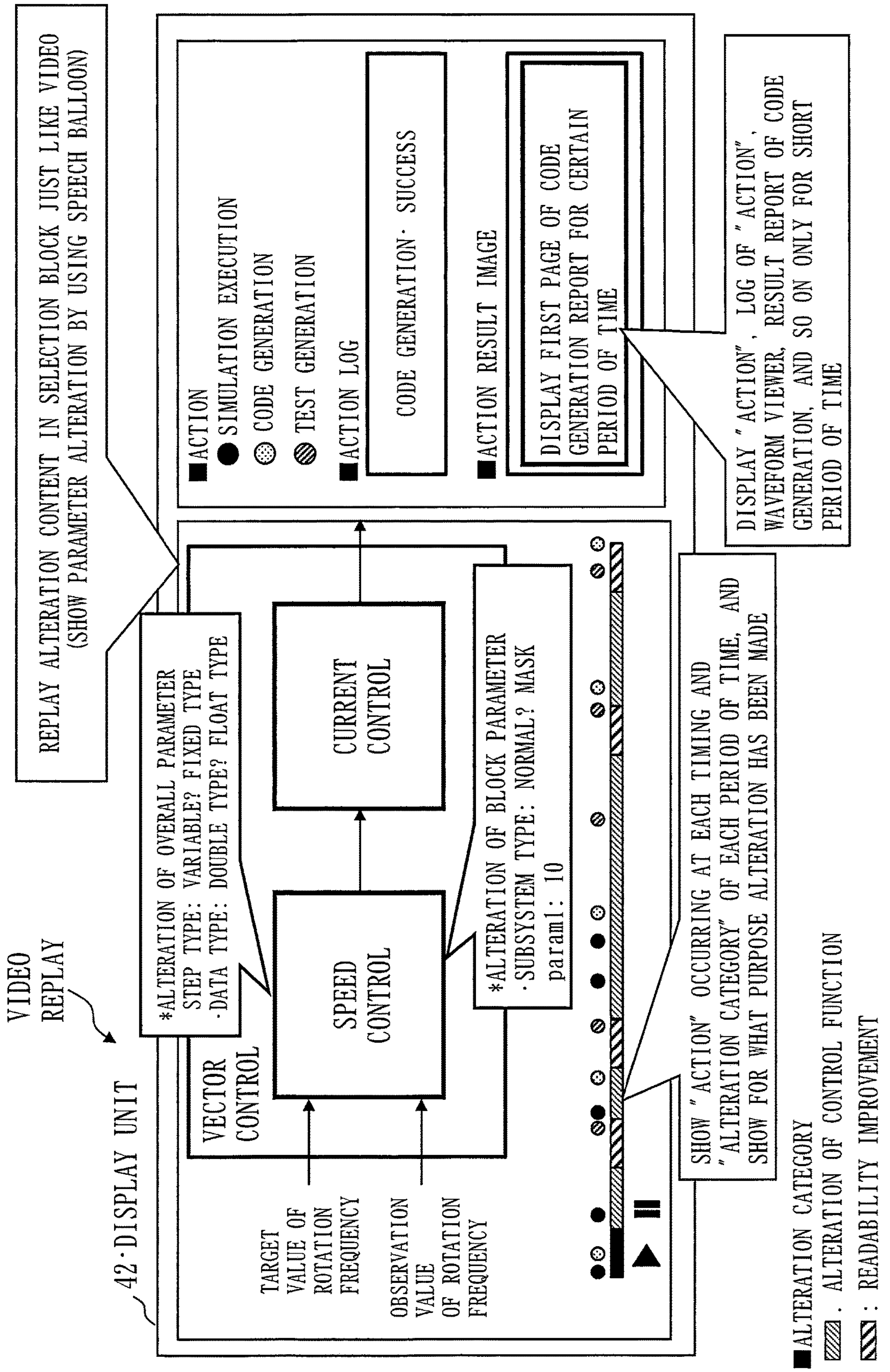
FIG. 10 is a diagram illustrating a display example at a display unit according to Embodiment 1.

FIG. 10 is a diagram illustrating a display example of a video at the display unit 42 according to the present embodiment.

In FIG. 10, each speech balloon has explanation on a portion what it points to.

Also, in FIG. 10, a subsystem "vector control" is decomposed into a process "speed control" and a process "current control". The "speed control" and "current control" are also called subsystems of the subsystem "vector control".

FIG. 10 illustrates a video in which a speech balloon "*contents of alteration of overall parameter" and a speech balloon "*contents of alteration of block parameter" are changing from time to time in accordance with a position on the seek bar. The speech balloon "*contents of alteration of overall parameter" includes contents "step type" and "data type". The speech balloon "*contents of alteration of block parameter" includes contents "type of subsystem" and "param1".

The display unit 42 displays a video part on the left half and an information display part on the right half. The information display part on the right half presents an action log or an action result image as they are changing from time to time in accordance with the position on the seek bar.

When an outline of the system model is completed, roughly, the contents of the speech balloons in the video are changing.

When the outline of the system model is not completed, there is a possibility that "speed control" or "current control" in "vector control" does not exist in the first place. There is also a possibility that another function such as "torque control" is incorporated in "vector control". In that case, generation and disappearance of such subsystem ("speed control" or "current control") of the subsystem may be expressed in the video.

In this manner, FIG. 10 presents a video in which all of the contents listed on the display unit 42 (subsystem of subsystem, contents of speech balloons, and input and output (target value of rotation frequency, observation value of rotation frequency)) are changing.

The contents listed on the display unit 42 will be described below.

The display unit 42 displays the video along a designated replay path. The video employs the speech balloon to express in detail a portion where alteration took place in the subsystem, that is, a difference between commits. In FIG. 10, speech balloons show "*alteration of overall parameter" and a speech balloon "*alteration of block parameter".

The replay button is a button to replay the video.

The stop button is a button to temporarily stop the video.

The seek bar shows a designated replay path of a designated subsystem by color coding on a basis of an alteration category. When the user clicks an arbitrary portion of the seek bar, the video is replayed from a relevant commit portion.

Actions are displayed above the seek bar. The actions are placed above the seek bar at positions corresponding to positions of the commits. The actions are displayed in colors in order to directly express contents concerning the actions.

FIG. 10 shows an action of simulation execution, an action of code generation, and an action of test generation.

Simulation execution is an action of checking whether, for example, each circuit operates normally in carryout out development using a system model, by using a waveform of a simulation in case of circuit design. Concerning execution of simulation, information on whether simulation is executed or not and a result of the execution (waveform of the simulation and the like) are given to each commit of the version control information 31, and are displayed.

Code generation and test generation are actions of performing code generation and test generation in carrying out development using a system model, on a basis of contents designed with the system model, and incorporating the codes and tests into a real machine and operating the real machine actually, thereby performing verification. Information on whether code generation and test generation are performed or not and a result of the generation (code generation (test generation) report) are given to each commit of the version control information, and are displayed.

As the action log, a log of implementation of the above action is displayed.

As the action result image, the result of implementation of the above action is displayed with a simplified format.

DESCRIPTION OF EFFECT OF PRESENT EMBODIMENT

As described above, with the revision history replay device according to the present embodiment, the data acquisition unit acquires a model revision history from the version control information, and the replay target selection unit causes a subsystem whose video is to be created, to be selected. Also, the video creation unit creates a video from a revision history corresponding to the selected subsystem. The created video enables the user to have a time-series bird's-eye view of how the model has been altered. As a result, a person other than the designer of the model can also recognize the intension of alteration by the designer easily from the revision history of the model.

With the revision history replay device according to the present embodiment, a replay path along which a video is to be replayed can be selected from the revision history of the model by the replay path selection unit. By selecting the replay path, the user can specify a range he or she wishes to watch out of the video. This facilitates specifying an essential alteration portion of the model revision history from the video.

With the revision history replay device according to the present embodiment, when the user manipulates a created video with the video player unit, the user manipulates the video. Hence, the user can replay and stop the video, can manipulate the seek bar, and can display an action content. This facilitates specifying an essential alteration portion of the model revision history from the video.

With the revision history replay device according to the present embodiment, when classifying the model revision history information in accordance with the alteration contents by the alteration category estimation unit, the model revision history information is classified by category of the alteration contents. Hence, the user need not check the alteration content of each alteration point. This facilitates specifying an essential alteration portion from the model revision history information.

With the revision history replay device according to the present embodiment, when estimating the replay path information in accordance with the alteration contents by the replay path estimation unit, the replay paths are classified by alteration category and by particular subsystem. This facilitates the user to identify a replay path, so it is easy to identify an essential alteration portion from the model revision history information from the video.

Other Configurations

Modification 1

Description has been made above concerning classifying the revision history of the subsystem in accordance with the alteration contents by using the alteration category estimation unit of step S103. Estimation by the alteration category estimation unit need not be performed in the above manner. For example, extraction of a model function alteration using a technique of equivalence checking may be employed.

Modification 2

Description has been made above concerning estimating the replay path information in accordance with the alteration contents. Estimation by the replay path estimation unit need not be performed by using the alteration category information. In this case, the replay path estimation unit may accept the revision history corresponding to the selected subsystem from the replay target selection unit, and may extract a particular function in the subsystem, thereby estimating the replay path information.

Modification 3

In the present embodiment, the functions of the data acquisition unit 110, replay target selection unit 120, alteration category estimation unit 130, replay path estimation unit 140, replay path selection unit 150, video creation unit 160, video player unit 170, and display window creation unit 180 are implemented by software. According to a modification, the functions of the data acquisition unit 110, replay target selection unit 120, alteration category estimation unit 130, replay path estimation unit 140, replay path selection unit 150, video creation unit 160, video player unit 170, and display window creation unit 180 may be implemented by hardware.

Specifically, a revision history replay device 100 is provided with an electronic circuit 909 in place of the processor 910.

Figure 11:
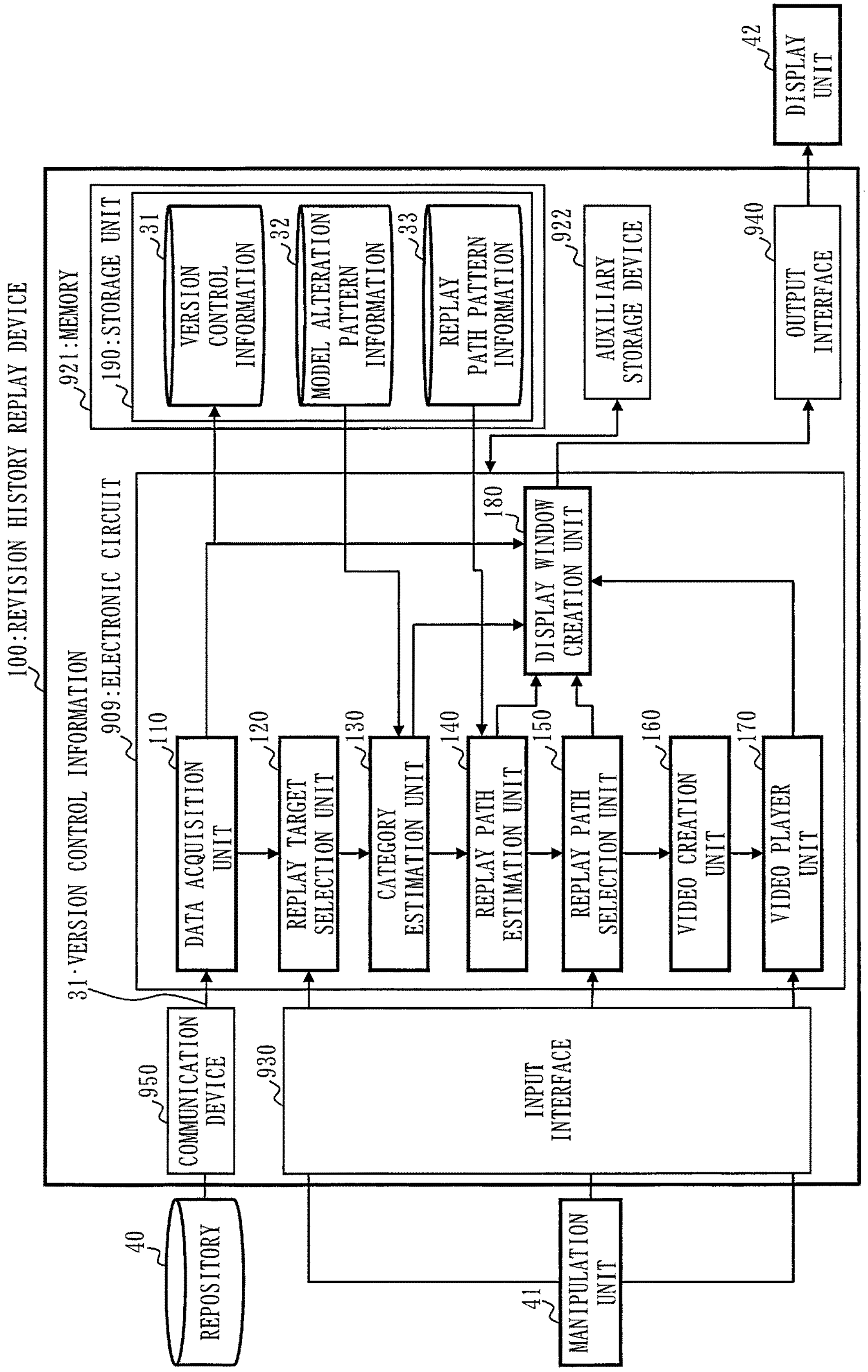
FIG. 11 is a diagram illustrating a configuration of a revision history replay device according to a modification of Embodiment 1.

FIG. 11 is a diagram illustrating a configuration of a revision history replay device 100 according to a modification of the present embodiment.

The electronic circuit 909 is a dedicated electronic circuit that implements the functions of the data acquisition unit 110, replay target selection unit 120, alteration category estimation unit 130, replay path estimation unit 140, replay path selection unit 150, video creation unit 160, video player unit 170, and display window creation unit 180. The electronic circuit 909 is specifically a single circuit, a composite circuit, a programmed processor, a parallel-programmed processor, a logic IC, a GA, an ASIC, or an FPGA. Note GA stands for Gate Array, ASIC for Application Specific Integrated Circuit, and FPGA for Field-Programmable Gate Array.

The functions of the data acquisition unit 110, replay target selection unit 120, alteration category estimation unit 130, replay path estimation unit 140, replay path selection unit 150, video creation unit 160, video player unit 170, and display window creation unit 180 may be implemented by one electronic circuit, or by a plurality of electronic circuit by distribution.

According to another modification, some of the functions of the data acquisition unit 110, replay target selection unit 120, alteration category estimation unit 130, replay path estimation unit 140, replay path selection unit 150, video creation unit 160, video player unit 170, and display window creation unit 180 may be implemented by an electronic circuit, and the remaining functions may be implemented by software. Also, some or all of the functions of the data acquisition unit 110, replay target selection unit 120, alteration category estimation unit 130, replay path estimation unit 140, replay path selection unit 150, video creation unit 160, video player unit 170, and display window creation unit 180 may be implemented by firmware.

The processor and the electronic circuit are also called processing circuitry. That is, the functions of the data acquisition unit 110, replay target selection unit 120, alteration category estimation unit 130, replay path estimation unit 140, replay path selection unit 150, video creation unit 160, video player unit 170, and display window creation unit 180 are implemented by processing circuitry.

In above Embodiment 1, the individual units of the revision history replay device are explained as independent function blocks. However, the revision history replay device need not have a configuration like that of the above embodiment. The function blocks of the revision history replay device may constitute any configuration as far as they can implement the functions described in the above embodiment. The revision history replay device need not be formed of one device but may be a system constituted of a plurality of devices.

A plurality of portions of Embodiment 1 may be practiced by combination. Alternatively, one portion of this embodiment may be practiced. Individual portions of this embodiment may be practiced by any combination entirely or partly.

That is, in Embodiment 1, the individual portions can be combined as desired; arbitrary constituent elements of this embodiment can be modified; or arbitrary constituent elements of this embodiment can be omitted.

The embodiments described above are an essentially preferred exemplification and is not intended to limit the scope of the present disclosure, the scope of applied products of the present disclosure, and the scope of usage of the present disclosure.

Various changes can be made in the embodiments described above as necessary. For example, procedures explained with using flowcharts or sequence diagrams may be changed appropriately.

REFERENCE SIGNS LIST

31: version control information; 32: model alteration pattern information; 33: replay path pattern information; 34: alteration category information; 40: repository; 41: manipulation unit; 42: display unit; 100: revision history replay device; 110: data acquisition unit; 120: replay target selection unit; 130: alteration category estimation unit; 140: replay path estimation unit; 150: replay path selection unit; 160: video creation unit; 170: video player unit; 180: display window creation unit; 190: storage unit; 909: electronic circuit; 910: processor; 921: memory; 922: auxiliary storage device; 930: input interface; 940: output interface; 950: communication device.

The invention claimed is:

1. A revision history replay device comprising:

processing circuitry to acquire version control information including: a model having information of a subsystem; and a revision history of the model;

to cause a subsystem to be selected from the model, and to extract a revision history corresponding to the subsystem from the version control information;

to create a video that replays a history of revision of the subsystem on a basis of the revision history corresponding to the subsystem;

to display to an output apparatus the video in which a content listed on the output apparatus is changing;

to classify the revision history corresponding to the subsystem into a category according to an alteration content, and to display the category-classified revision history corresponding to the subsystem as alteration category information by color coding per category; and to estimate a replay path per category on a basis of the revision history corresponding to the subsystem and on a basis of the alteration category information, and to display the replay path per category obtained by the estimation as replay path information per category.

2. The revision history replay device according to claim 1, wherein the processing circuitry causes a replay path for replaying the history of revision of the subsystem, to be selected from the replay path information displayed per category on a basis of the revision history corresponding to the subsystem, and creates the video that replays the history of revision of the subsystem along the replay path.

3. The revision history replay device according to claim 2, wherein the processing circuitry manipulates the video.

4. The revision history replay device according to claim 2, wherein the processing circuitry causes a replay path for replaying the history of revision of the subsystem, to be selected from the replay path information displayed per category.

5. The revision history replay device according to claim 3, wherein the processing circuitry causes a replay path for replaying the history of revision of the subsystem, to be selected from the replay path information displayed per category.

6. The revision history replay device according to claim 4, which stores, in a storage unit, model alteration pattern information in which the category and the alteration content are associated with each other, wherein the processing circuitry classifies the revision history corresponding to the subsystem into the category according to the alteration content on a basis of the model alteration pattern information.

7. The revision history replay device according to claim 5, which stores, in a storage unit, model alteration pattern information in which the category and the alteration content are associated with each other, wherein the processing circuitry classifies the revision history corresponding to the subsystem into the category according to the alteration content on a basis of the model alteration pattern information.

8. The revision history replay device according to claim 4, which stores, in a storage unit, replay path pattern information used for estimating the replay path for replaying the history of revision of the subsystem under a particular condition, the replay path pattern information including an evaluation axis of each alteration of the revision history corresponding to the subsystem, wherein the processing circuitry evaluates each alteration of the revision history corresponding to the subsystem with using the replay path pattern information, thereby estimating a replay path including an alteration for understanding an intension of design per category, as the replay path information.

9. The revision history replay device according to claim 5, which stores, in a storage unit, replay path pattern information used for estimating the replay path for replaying the history of revision of the subsystem under a particular condition, the replay path pattern information including an evaluation axis of each alteration of the revision history corresponding to the subsystem, wherein the processing circuitry evaluates each alteration of the revision history corresponding to the subsystem with using the replay path pattern information, thereby estimating a replay path including an alteration for understanding an intension of design per category, as the replay path information.

10. The revision history replay device according to claim 6, which stores, in the storage unit, replay path pattern information used for estimating the replay path for replaying the history of revision of the subsystem under a particular condition, the replay path pattern information including an evaluation axis of each alteration of the revision history corresponding to the subsystem, wherein the processing circuitry evaluates each alteration of the revision history corresponding to the subsystem with using the replay path pattern information, thereby estimating a replay path including an alteration for understanding an intension of design per category, as the replay path information.

11. The revision history replay device according to claim 7, which stores, in the storage unit, replay path pattern information used for estimating the replay path for replaying the history of revision of the subsystem under a particular condition, the replay path pattern information including an evaluation axis of each alteration of the revision history corresponding to the subsystem, wherein the processing circuitry evaluates each alteration of the revision history corresponding to the subsystem with using the replay path pattern information, thereby estimating a replay path including an alteration for understanding an intension of design per category, as the replay path information.

12. A revision history replay method comprising:

acquiring version control information including: a model having information of a subsystem; and a revision history of the model;

causing a subsystem to be selected from the model, and extracting a revision history corresponding to the subsystem from the version control information;

creating a video that replays a history of revision of the subsystem on a basis of the revision history corresponding to the subsystem;

displaying to an output apparatus the video in which a content listed on the output apparatus is changing;

classifying the revision history corresponding to the subsystem into a category according to an alteration content, and displaying the category-classified revision history corresponding to the subsystem as alteration category information by color coding per category; and estimating a replay path per category on a basis of the revision history corresponding to the subsystem and on a basis of the alteration category information, and displaying the replay path per category obtained by the estimation as replay path information per category.

13. A non-transitory computer readable medium storing a revision history replay program which causes a computer to execute:

a data acquisition process of acquiring version control information including: a model having information of a subsystem; and a revision history of the model;

a replay target selection process of causing a subsystem to be selected from the model, and extracting a revision history corresponding to the subsystem from the version control information;

a video creation process of creating a video that replays a history of revision of the subsystem on a basis of the revision history corresponding to the subsystem;

a display window creation process of displaying to an output apparatus the video in which a content listed on the output apparatus is changing;

an alteration category estimation process of classifying the revision history corresponding to the subsystem into a category according to an alteration content, and displaying the category-classified revision history corresponding to the subsystem as alteration category information by color coding per category; and a replay path estimation process of estimating a replay path per category on a basis of the revision history corresponding to the subsystem and on a basis of the alteration category information, and displaying the replay path per category obtained by the estimation as replay path information per category.

* * * * *